US007493581B2

(12) United States Patent
Siegel et al.

(10) Patent No.: US 7,493,581 B2
(45) **Date of Patent: *Feb. 17, 2009**

(54) ANALYTICAL PLACEMENT METHOD AND APPARATUS

(75) Inventors: Andrew Siegel, Shoreline, WA (US); Steven Teig, Menlo Park, CA (US); Hussein Etawil, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 309 days.

This patent is subject to a terminal disclaimer.

(21) Appl. No.: 11/370,245

(22) Filed: Mar. 6, 2006

(65) Prior Publication Data

US 2006/0236291 A1 Oct. 19, 2006

Related U.S. Application Data

(63) Continuation of application No. 10/236,463, filed on Sep. 6, 2002, now Pat. No. 7,058,913.

(60) Provisional application No. 60/317,867, filed on Sep. 6, 2001.

(51) Int. Cl.
*G06F 17/50* (2006.01)

(52) U.S. Cl. ............................... 716/9; 716/10; 716/12; 716/13

(58) Field of Classification Search ..................... 716/9, 716/10, 12, 13

See application file for complete search history.

(56) References Cited

U.S. PATENT DOCUMENTS 4,593,363 A 6/1986 Burstein et al.
4,615,011 A 9/1986 Linsker
4,855,929 A 8/1989 Nakajima
5,097,422 A * 3/1992 Corbin et al. .................. 716/8
5,267,176 A 11/1993 Antreich et al.

(Continued)

FOREIGN PATENT DOCUMENTS

JP 64-15947 1/1989

(Continued)

OTHER PUBLICATIONS

NB82123619, "Weighted and Iterative Multi-wire Routing", IBM Technical Disclosure Bulletin, vol. 25, No. 7B, Dec. 1982, pp. 3619-3628.*

(Continued)

*Primary Examiner*—Phallaka Kik
(74) *Attorney, Agent, or Firm*—Adeli & Tollen LLP

(57) ABSTRACT

Some embodiments provide an analytical placement method that considers diagonal wiring. This method formulates an objective function that accounts for the use of diagonal wiring during routing. Some embodiments use horizontal, vertical, and ±45° diagonal lines. For such a wiring model, some embodiments use the following objective function:

$$\text{Function} = \sum_{n}\sum_{p(n)} b_{i,j}\left(\begin{array}{l}\frac{1}{\sqrt{2}}\left(\sqrt{\beta+(x_i-x_j)^2}+\sqrt{\beta+(y_i-y_j)^2}\right)+\\ \left(1-\frac{1}{\sqrt{2}}\right)\sqrt{\begin{array}{l}\beta+(x_i-x_j)^2+(y_i-y_j)^2-\\ \frac{2(x_i-x_j)^2(y_i-y_j)^2}{\sqrt{\beta+(x_i-x_j)^2(y_i-y_j)^2}}\end{array}}\end{array}\right)$$

In this equation, n represents a net, p(n) represents a unique pair of pins i and j of the net n, x and y represent the x-, and y-coordinates of a particular pin, and $b_{i,j}$ represents a weighting factor that biases the function based on the desired closeness of pins i and j.

22 Claims, 6 Drawing Sheets

Start
705 Specify placement problem with appropriate objective function
710 Solve to obtain placement
715 Partition the region
720 Specify placement problem with appropriate objective function
725 Solve to obtain new placement
730 Stop? No / Yes
735 Identify placement within final set of sub-regions
END

U.S. PATENT DOCUMENTS

| | | | |
|---|---|---|---|
| 5,375,069 A | 12/1994 | Satoh et al. | |
| 5,532,934 A | 7/1996 | Rostoker | |
| 5,566,078 A | 10/1996 | Ding et al. | |
| 5,578,840 A | 11/1996 | Scepanovic et al. | |
| 5,587,923 A | 12/1996 | Wang | |
| 5,615,126 A * | 3/1997 | Deeley et al. | 716/1 |
| 5,618,744 A | 4/1997 | Suzuki et al. | |
| 5,633,479 A | 5/1997 | Hirano | |
| 5,634,093 A | 5/1997 | Ashida et al. | |
| 5,636,125 A | 6/1997 | Rostoker et al. | |
| 5,637,920 A | 6/1997 | Loo | |
| 5,640,327 A | 6/1997 | Ting | |
| 5,650,653 A | 7/1997 | Rostoker et al. | |
| 5,663,891 A | 9/1997 | Bamji et al. | |
| 5,742,086 A | 4/1998 | Rostoker et al. | |
| 5,757,089 A | 5/1998 | Ishizuka | |
| 5,757,656 A | 5/1998 | Hershberger et al. | |
| 5,777,360 A | 7/1998 | Rostoker et al. | |
| 5,784,289 A | 7/1998 | Wang | |
| 5,798,936 A | 8/1998 | Cheng | |
| 5,811,863 A | 9/1998 | Rostoker et al. | |
| 5,822,214 A * | 10/1998 | Rostoker et al. | 716/10 |
| 5,838,583 A | 11/1998 | Varadarajan et al. | |
| 5,859,449 A | 1/1999 | Kobayashi et al. | |
| 5,889,677 A | 3/1999 | Yasuda et al. | |
| 5,898,597 A | 4/1999 | Scepanovic et al. | |
| 5,914,887 A | 6/1999 | Scepanovic et al. | |
| 5,973,376 A | 10/1999 | Rostoker et al. | |
| 5,980,093 A | 11/1999 | Jones et al. | |
| 6,035,108 A * | 3/2000 | Kikuchi | 716/2 |
| 6,058,254 A | 5/2000 | Scepanovic et al. | |
| 6,068,662 A | 5/2000 | Scepanovic et al. | |
| 6,070,108 A | 5/2000 | Andreev et al. | |
| 6,123,736 A | 9/2000 | Pavisic et al. | |
| 6,128,767 A | 10/2000 | Chapman | |
| 6,134,702 A | 10/2000 | Scepanovic et al. | |
| 6,155,725 A | 12/2000 | Scepanovic et al. | |
| 6,175,950 B1 | 1/2001 | Scepanovic et al. | |
| 6,209,123 B1 | 3/2001 | Maziasz et al. | |
| 6,216,252 B1 | 4/2001 | Dangelo et al. | |
| 6,226,560 B1 * | 5/2001 | Hama et al. | 700/97 |
| 6,230,306 B1 | 5/2001 | Raspopovich et al. | |
| 6,247,167 B1 | 6/2001 | Raspopovich et al. | |
| 6,249,902 B1 | 6/2001 | Igusa et al. | |
| 6,253,363 B1 | 6/2001 | Gasanov et al. | |
| 6,260,179 B1 | 7/2001 | Ohsawa et al. | |
| 6,262,487 B1 | 7/2001 | Igarashi et al. | |
| 6,289,495 B1 | 9/2001 | Raspopovich et al. | |
| 6,292,929 B2 | 9/2001 | Scepanovic et al. | |
| 6,295,634 B1 | 9/2001 | Matsumoto | |
| 6,301,686 B1 * | 10/2001 | Kikuchi et al. | 716/2 |
| 6,317,864 B1 * | 11/2001 | Kikuchi et al. | 716/11 |
| 6,324,674 B2 | 11/2001 | Andreev et al. | |
| 6,324,675 B1 | 11/2001 | Dutta et al. | |
| 6,327,693 B1 | 12/2001 | Cheng et al. | |
| 6,327,694 B1 | 12/2001 | Kanazawa | |
| 6,330,707 B1 | 12/2001 | Shinomiya et al. | |
| 6,378,121 B2 | 4/2002 | Hiraga | |
| 6,385,758 B1 * | 5/2002 | Kikuchi et al. | 716/2 |
| 6,401,234 B1 | 6/2002 | Alpert et al. | |
| 6,405,358 B1 | 6/2002 | Nuber | |
| 6,407,434 B1 | 6/2002 | Rostoker et al. | |
| 6,412,097 B1 | 6/2002 | Kikuchi et al. | |
| 6,412,102 B1 | 6/2002 | Andreev et al. | |
| 6,415,422 B1 | 7/2002 | Mehrotra et al. | |
| 6,415,427 B2 | 7/2002 | Nitta et al. | |
| 6,436,804 B2 | 8/2002 | Igarashi et al. | |
| 6,442,743 B1 | 8/2002 | Sarrafzadeh et al. | |
| 6,448,591 B1 | 9/2002 | Juengling | |
| 6,463,575 B1 | 10/2002 | Takahashi | |
| 6,473,891 B1 | 10/2002 | Shively | |
| 6,480,991 B1 | 11/2002 | Cho et al. | |
| 6,490,707 B1 * | 12/2002 | Baxter | 716/2 |
| 6,490,713 B2 | 12/2002 | Matsumoto | |
| 6,516,455 B1 * | 2/2003 | Teig et al. | 716/7 |
| 6,519,745 B1 * | 2/2003 | Srinivas et al. | 716/5 |
| 6,519,751 B2 | 2/2003 | Sriram et al. | |
| 6,526,540 B1 * | 2/2003 | Fong et al. | 716/1 |
| 6,526,555 B1 * | 2/2003 | Teig et al. | 716/11 |
| 6,526,563 B1 * | 2/2003 | Baxter | 716/18 |
| 6,543,043 B1 | 4/2003 | Wang et al. | |
| 6,546,540 B1 | 4/2003 | Igarashi et al. | |
| 6,557,145 B2 | 4/2003 | Boyle et al. | |
| 6,567,967 B2 | 5/2003 | Greidinger et al. | |
| 6,590,289 B2 | 7/2003 | Shively | |
| 6,606,732 B2 * | 8/2003 | Buffet et al. | 716/4 |
| 6,618,849 B2 | 9/2003 | Teig et al. | |
| 6,629,308 B1 * | 9/2003 | Baxter | 716/16 |
| 6,645,842 B2 | 11/2003 | Igarashi et al. | |
| 6,651,233 B2 * | 11/2003 | Teig et al. | 716/7 |
| 6,671,859 B1 * | 12/2003 | Naylor et al. | 716/2 |
| 6,671,864 B2 * | 12/2003 | Teig et al. | 716/8 |
| 6,678,872 B2 * | 1/2004 | Teig et al. | 716/7 |
| 6,687,893 B2 | 2/2004 | Teig et al. | |
| 6,691,296 B1 * | 2/2004 | Nakayama et al. | 716/15 |
| 6,711,727 B1 * | 3/2004 | Teig et al. | 716/12 |
| 6,738,960 B2 | 5/2004 | Teig et al. | |
| 6,745,379 B2 | 6/2004 | Teig et al. | |
| 6,763,508 B2 | 7/2004 | Igarashi et al. | |
| 6,769,105 B1 * | 7/2004 | Teig et al. | 716/12 |
| 6,795,958 B2 | 9/2004 | Teig et al. | |
| 6,802,049 B2 * | 10/2004 | Teig et al. | 716/7 |
| 6,826,737 B2 * | 11/2004 | Teig et al. | 716/7 |
| 6,829,757 B1 * | 12/2004 | Teig et al. | 716/12 |
| 6,848,091 B2 * | 1/2005 | Teig et al. | 716/7 |
| 6,858,928 B1 * | 2/2005 | Teig et al. | 257/700 |
| 6,858,935 B1 * | 2/2005 | Teig et al. | 257/758 |
| 6,859,916 B1 * | 2/2005 | Teig et al. | 716/13 |
| 6,877,149 B2 | 4/2005 | Teig et al. | |
| 6,883,154 B2 | 4/2005 | Teig et al. | |
| 6,904,580 B2 * | 6/2005 | Teig et al. | 716/7 |
| 6,907,593 B2 | 6/2005 | Teig et al. | |
| 6,915,501 B2 | 7/2005 | Teig et al. | |
| 6,931,616 B2 | 8/2005 | Teig et al. | |
| 6,951,005 B1 * | 9/2005 | Teig et al. | 716/12 |
| 6,952,815 B2 | 10/2005 | Teig et al. | |
| 6,957,410 B2 | 10/2005 | Teig et al. | |
| 6,988,256 B2 * | 1/2006 | Teig et al. | 716/7 |
| 7,003,754 B2 | 2/2006 | Teig et al. | |
| 7,013,450 B2 | 3/2006 | Teig et al. | |
| 7,024,650 B2 * | 4/2006 | Teig et al. | 716/12 |
| 7,055,120 B2 | 5/2006 | Teig et al. | |
| 7,069,530 B1 * | 6/2006 | Teig et al. | 716/12 |
| 7,073,150 B2 | 7/2006 | Teig et al. | |
| 7,080,336 B2 | 7/2006 | Teig et al. | |
| 7,089,523 B2 * | 8/2006 | Teig et al. | 716/12 |
| 7,096,448 B2 | 8/2006 | Teig et al. | |
| 7,096,449 B1 * | 8/2006 | Teig et al. | 716/12 |
| 7,107,564 B1 * | 9/2006 | Teig et al. | 716/13 |
| 7,139,994 B2 | 11/2006 | Teig et al. | |
| 7,143,382 B2 | 11/2006 | Teig et al. | |
| 7,155,697 B2 | 12/2006 | Teig et al. | |
| 7,398,498 B2 | 7/2008 | Teig et al. | |
| 2001/0018762 A1 * | 8/2001 | Lenzie | 716/16 |
| 2001/0025368 A1 * | 9/2001 | Cooke et al. | 716/13 |
| 2002/0073384 A1 * | 6/2002 | Buffet et al. | 716/4 |
| 2002/0100007 A1 * | 7/2002 | Teig et al. | 716/7 |
| 2002/0124231 A1 * | 9/2002 | Teig et al. | 716/7 |
| 2002/0170027 A1 * | 11/2002 | Teig et al. | 716/10 |
| 2003/0051217 A1 * | 3/2003 | Cheng | 716/5 |
| 2003/0088841 A1 * | 5/2003 | Teig et al. | 716/8 |
| 2003/0121015 A1 * | 6/2003 | Teig et al. | 716/7 |
| 2003/0188286 A1 * | 10/2003 | Teig et al. | 716/13 |
| 2003/0192021 A1 * | 10/2003 | Teig et al. | 716/7 |

2003/0217346 A1* 11/2003 Teig et al. ...................... 716/7
2004/0123260 A1* 6/2004 Teig et al. ...................... 716/7
2006/0236291 A1* 10/2006 Siegel et al. .................. 716/13

FOREIGN PATENT DOCUMENTS

| | | | | |
|---|---|---|---|---|
| JP | 03-173471 | A | | 7/1991 |
| JP | 04247579 | A | * | 9/1992 |
| JP | 05-102305 | A | | 4/1993 |
| JP | 05-243379 | A | | 9/1993 |
| JP | 07-86407 | A | | 3/1995 |
| JP | 09-162279 | A | | 6/1997 |
| JP | 411296560 | A | | 10/1999 |
| JP | 2000-82743 | A | | 3/2000 |

OTHER PUBLICATIONS

NB83123895, "Wiring Multinode Nets", IBM Technical Disclosure Bulletin, vol. 26, No. 7B, Dec. 1983, pp. 3895-3900.*
NN71091316, "Use of Relatively Diagonal and Rectangular Wiring Planes in Multilayer Packages", IBM Technical Disclosure Bulletin, vol. 14, No. 4, Sep. 1971, pp. 1316-1317.*
NN74033359, "Net Ordering for an Autowire Program", IBM Techical Disclosure Bulletin, vol. 16, No. 10, Mar. 1974, pp. 3359-3361.*
Notice of Allowance of U.S. Appl. No. 10/236,463, mailing date Nov. 7, 2005, Teig et al., now issued as Patent No. 7,058,913.
Final Office Action of U.S. Appl. No. 10/236,463, mailing date Mar. 23, 2005, Teig et al., now issued as Patent No. 7,058,913.
Non-Final Office Action of U.S. Appl. No. 10/236,463, mailing date Oct. 5, 2004, Teig et al., now issued as Patent No. 7,058,913.
Ahuja, R. et al., Faster Algorithms for the Shortest Path Problem, Journal of the Association for Computing Machinery, vol. 37, No. 2, Apr. 1990, pp. 213-223.
Alexander, M. et al., Performance-Oriented Placement and Routing for Field-Programmable gate arrays, Proceedings of the European Design Automation Conference, pp. 80-85, 1995.
Alexander, M et al., Placement and Routing for Performance-Oriented FPGA Layout, VLSI Design, vol. 7, No. 1, 1998.
Brady, L. et al., Channel Routing on a 60° Grid, extended abstract, pp. 926-931, no date.
Brambilla, A. et al., Statistical Method for the Analysis of Interconnects Delay in Submicrometer Layouts, IEEE, Aug. 2001, pp. 957-966.
Carothers, K., A Method of Measuring Nets Routability for MCM's General Area Routing Problems, 1999, pp. 186-192.
Chen, H. et al., "Bubble-sort approach to channel routing", IEE Proceedings of Computers and Digital Techniques, vol. 147, No. 6 Nov. 2000, pp. 415-422.
Chen, H. et al., Physical Planning of On-Chip Interconnect Architectures, 2002, IEEE, International Conference, pp. 30-35.
Cheng, K., Steiner Problem in Octilinear Routing Model, a Thesis Submitted for the Degree of Master of Science, National University Singapore, 1995, pp. 1-122.
Cheng, K. et al., Manhattan or Non Manhattan? A Study of Alternative VLSI Routing Architectures, pp. 47-52, 2000.
Chip Model with Wiring Cost Map, Aug. 1983, IBM Technical Disclosure Bulletin, vol. 26, iss. 3A, pp. 929-933.
Chiang, C. et al., Wirability of Knock-Knee Layouts with 45° Wires, IEEE Transactions on Circuits and Systems, vol. 38, issue 6, pp. 613-624, Jun. 1991.
Cho, J., Wiring space and length estimation in two-dimensional arrays, IEEE Transactions on Computer-Aided Design of Integrated Circuits and Systems, vol. 19, No. 5, May 2000, pp. 612-615.
Cong, J. et al., Efficient Heuristics for the Minimum Shortest Path Steiner Arborescence Problem with Applications to VLSI Physical Design, Cadence Design Systems and UCLA Computer Science Department, pp. 89-95, no date.
Cong, J. et al., Performance-Driven Multi-Layer General Routing for PCB/MCM Designs, UCLA Computer Science Department, 1998, pp. 356-361.
Dood, P. et al., A Two-Dimensional Topological Compactor with Octagonal Geometry, 28th ACM/IEEE Design Automation Conference, pp. 727-731, Jul. 1991.
Dutt, S. et al., Probability-Based Approached to VLSI Circuit Partitioning, IEEE Trans. on Computer-Aided Design of IC's and Systems, vol. 19, No. 5, May 2000, pp. 534-549.
Enbody, R. et al., Near-Optimal n-Layer Channel Routing, 23rd Design Automation Conference, 1986, pp. 708-714.
Fang, S. et al., Constrained Via Minimization with Practical Considerations for Multi-Layer VLSI/PCB Routing Problems, 28th ACM/IEEE Design Automation Conference, 1991, pp. 60-65.
Farrahi, A. et al., Quality of EDA CAD Tools: Definitions, Metrics, and Directions, Quality Electronic Design, 2000, Proceedings of the first International Symposium on Mar. 2000, pp. 395-405.
Hom, I. et al., Estimation of the Number of Routing Layers and Total Wirelength in a PCB Through Wiring Distribution Analysis, 1996, pp. 1-6.
Hong, X. et al., Performance-Driven Steiner Tree Algorithms for Global Routing, 30th ACM/IEEE Design Automation Conference, 1993, pp. 177-181.
Hu, J. et al., A Timing-Constrained Algorithm for Simultaneous Global Routing of Multiple Nets, IEEE/ACM International Conference on Computer Aided Design. ICCAD—2000. IEEE/ACM Digest of Technical Papers (CAT. No. 00CH37140), Proceedings of International Conference on Computer Aided Design (ICCAD), San Jose, CA USA, Nov. 5-9, 2000, pp. 99-103.
Igarashi, M. et al., A Diagonal-Interconnect Architecture and Its Application to RISC Core Design, 2002, IEEE Solid-State Circuits Conference, pp. 210-460, Feb. 2002.
Kastner, R. et al., Predictable Routing, IEEE/ACM International Conference on Computer Aided Design. ICCAD—2000. IEEE/ACM Digest of Technical Papers (CAT NO. 00CH37140), Proceedings of International Conference on Computer Aided Design (ICCAD), San Jose, CA USA, Nov. 5-9, 2000, pp. 110-113.
Kahng, A., et al., "Implementation and Extensibility of an Analytic Placer", ISPD '04, ACM, Apr. 18-21, 2004, pp. 1-8.
Khoo, K. et al., An Efficient Multilayer MCM Router Based on Four-Via Routing, 30th ACM/IEEE Design Automation Conference, 1993, pp. 590-595.
Lillis, J. et al., Table-Lookup Methods for Improved Performance-Driven Routing, 1998, pp. 368-373.
Lipski, W. et al., A Unified Approach to Layout Wirability, Mathematical Systems Theory, 1987, pp. 189-203.
Lodi, E. et al., A Preliminary Study of a Diagonal Channel-Routing Model, Algorithmica, 1989, pp. 585-597.
Lodi, E. et al., Lecture Notes in Computer Science, A 4d Channel Router for a Two Layer Diagonal Model, pp. 464-476, Jul. 1988.
Naclerio, N. et al., Via Minimization for Gridless Layouts, 24th ACM/IEEE Design Automation Conference, 1987, pp. 159-165.
Nam, G. et al, Satisfiability-Based Layout Revisited: Detailed Routing of Complex FPGAs Via Search-Based Boolean SAT, 1999, pp. 167-175.
Oh, J. et al., Constructing Lower and Upper Bounded Delay Routing Trees Using Linear Programming, 33rd Design Automation Conference, 1996.
Parakh, P. et al., Congestion Driven Quadratic Placement, Proceedings of Design Automation Conference, 1998, pp. 275-278.
Partitioning Logic on to Graph Structure, IBM Technical Disclosure Bulletin, Feb. 1990, vol. 32, iss. 9A, pp. 469-475.
Phillips, N., Channel Routing by Constraint Logic, Department of Computer Science Southern Illinois University, ACM, 1992.
Powers, K. et al., The 60° Grid: Routing Channels in Width d/√3, VLSI, 1991, Proceedings, First Great lakes Symposium on Kalamazoo, MI, USA, pp. 241-291, Mar. 1991.
Putatunda, P. et al., Vital: Fully Automated Placement Strategies for Very Large Semicustom Designs, Proceedings of the International Conference on Computer Design: VLSI in Computers and Processors, pp. 434-439, Oct. 1988.
Sekiyama, Y. et al., Timing-Oriented Routers for PCB Layout Design of High-Performance Computers, International Conference on Computer Aided Design, pp. 332-335, Nov. 1991.
Su, J. et al., Post-Route Optimization for Improved Yield Using Rubber-Band Wiring Model, International Conference on Computer-Aided Design, pp. 700-706, Nov. 1997.

Takashima, Y. et al, Routability of FPGAs with External Switch-Block Structures, IEICE Trans. Fundamentals, vol. E81-A, No. 5, May 1998, pp. 850-856.

Thakur, S. et al., Algorithms for a Switch Module Routing Problem, 1994, pp. 265-270.

Theune, D. et al., HERO: Hierarchical EMC-constrained routing, Nov. 1992, IEEE pp. 468-472.

Tseng, H. et al., Timing and Crosstalk Driven Area Routing, pp. 378-381, no date.

Vicente, J. et al., RSR: A New Rectilinear Steiner Minimum tree Approximation for FPGA Placement and Global Routing, proceedings of the 24th Euro Micro Conference, pp. 192-195, Aug. 1998.

Wang, D., Novel Routing Schemes for IC Layout, Part I: Two-Layer Channel Routing, 28th ACM/IEEE Automation Conference, 1991, pp. 49-53.

Wang, M. et al., Modeling and Minimization of Routing Congestion, Jan. 2000, IEEE proceedings of ASP-DAC, Asia and South Pacific, pp. 185-190.

Wood, R. et al., FPGA Routing and Routability Estimation Via Boolean Satisfiability, Department of Electrical and Computer Engineering Carnegie Mellon University, Pittsburgh, PA, pp. 119-125, no date.

Zhang, C-X. et al., Floorplan Design Using a Hierarchical Neutral Learning Algorithm, IEEE, Jun. 1991. pp. 2060-2063.

Zhou, H. et al., An Optimal Algorithm for River Routing with Crosstalk Constraints, 1996.

Zhou, H. et al., Global Routing with Crosstalk Constraints, Department of Computer Sciences, University of Texas, 1998, pp. 374-377.

Zhou, H. et al., Optimal River Routing with Crosstalk Constraints, ACM Transactions on Design Automation of Electronic Systems, vol. 3, No. 3, Jul. 1998, pp. 496-514.

NN7308862, "Force Directed Interchange (FDI) for the Module Placement Problem and the Quadratic Assignment Problem", IBM Technical Disclosure Bulletin, vol. 16, No. 3, Aug. 1973, pp. 862-863 (4 pages).

* cited by examiner

ANALYTICAL PLACEMENT METHOD AND APPARATUS

CLAIM OF BENEFIT TO PRIOR APPLICATION

This application is a continuation of U.S. patent application Ser. No. 10/236,463, now U.S. Pat. No. 7,058,913, filed Sep. 6, 2002, which claims benefit to U.S. Provisional Patent Application 60/317,867, filed on Sep. 6, 2001, U.S. Provisional Patent Application 60/317,867 is incorporated herein by reference.

FIELD OF THE INVENTION

The invention is directed towards analytical placers that consider diagonal wiring.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components. Traditionally, IC's use preferred direction ("PD") wiring models, which specify a preferred wiring direction for each of their wiring layers. In preferred direction wiring models, the preferred direction typically alternates between successive wiring layers. One example of a PD wiring model is the PD Manhattan wiring model, which specifies alternating layers of preferred-direction horizontal and vertical wiring.

Wiring models have been proposed that allow wiring in diagonal directions (e.g., one wiring model allows wiring in horizontal, vertical, and ±45° diagonal directions). Some of these wiring models are non-preferred direction ("NPD") wiring models. An NPD wiring model has at least one NPD wiring layer, on which two or more wiring directions are equally preferable and are at least as preferable as all other wiring directions on that layer.

Engineers design IC's by transforming logical or circuit descriptions of the IC's into geometric descriptions, called layouts. IC layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. A list of all or some of the nets in a layout is referred to as a net list.

To create layouts, design engineers typically use electronic design automation ("EDA") applications. These applications provide sets of computer-based tools for creating, editing, and analyzing IC design layouts. The IC design process entails various operations. One of these operations is placement, which is the process of arranging the circuit modules on a layout in order to achieve certain objectives, such as reducing layout area, wirelength, wire congestion, etc.

Numerous EDA placers have been proposed to date. Many placers try to reduce expected length of wires for routing nets. A wirelength minimization problem includes as given n modules with areas $a_1, a_2, \ldots, a_n$, and m edges $e_1, e_2, \ldots e_m$ where edge $e_i$ has importance $b_i$ and links module $e_{i1}$ to module $e_{i2}$. A placement typically specifies a location $(x_j, y_j)$ for each module j within a specified two-dimensional space. The importance-weighted wire length measure is:

$$\sum_{i=1}^{m} b_i L(x_{e_{i2}} - x_{e_{i1}}, y_{e_{i2}} - y_{e_{i1}}),$$

where L(x,y) is the minimum wire length needed to connect (0,0) to (x,y). The objective is to minimize this importance-weighted wire length measure, subject to constraints. A typical constraint is that, within a sub-region of the placement, the total component area does not exceed the area of the sub-region.

Certain placers are analytical placers. An analytical placer typically performs the following three operations. First, it formulates an objective function to express the placement of one or more circuit elements (e.g., circuit modules) in a layout. Second, the placer solves the objective function to identify a placement. Third, it iteratively specifies additional placement constraints and performs the first two operations until it reaches a condition for terminating the iterations.

Examples of analytical placers include quadratic and linear placers. Quadratic placers use the sum of the squared Euclidean distance between each pair of pins of each net as the objective function. This objective function is expressed by the following formula:

$$\text{Function} = \sum_{n} \sum_{p(n)} b_{i,j}((x_i - x_j)^2 + (y_i - y_j)^2),$$

where n represents a net, p(n) represents a unique pair of pins i and j of the net n, x and y represent the x-, and y-coordinates of a particular pin, and $b_{i,j}$ represents a weighting factor that biases the function based on the desired closeness of pins i and j. Linear placers use the Manhattan distance between each pair of pins of each net as the objective function. This objective function is expressed by the following formula:

$$\text{Function} = \sum_{n} \sum_{p(n)} b_{i,j}(|x_i - x_j| + |y_i - y_j|).$$

Prior analytical placers do not consider the possibility of diagonal wiring. Hence, these techniques result in poor placement configurations for routers that use diagonal wiring. Such placement configurations inefficiently consume the layout area, utilize too much wire, and/or have poor wire congestions. Consequently, there is a need in the art for analytical placers that consider the possible use of diagonal wiring during routing.

SUMMARY OF THE INVENTION

Some embodiments provide an analytical placement method that considers diagonal wiring. This method formulates an objective function that accounts for the use of diagonal wiring during routing. Some embodiments use horizontal, vertical, and ±45° diagonal lines. For such a wiring model, some embodiments use the following objective function:

$$\text{Function} = \sum_{n}\sum_{p(n)} b_{i,j}\left(\begin{array}{l}\frac{1}{\sqrt{2}}\left(\sqrt{\beta+(x_i-x_j)^2}+\sqrt{\beta+(y_i-y_j)^2}\right)+\\ \left(1-\frac{1}{\sqrt{2}}\right)\sqrt{\begin{array}{l}\beta+(x_i-x_j)^2+(y_i-y_j)^2-\\ \frac{2(x_i-x_j)^2(y_i-y_j)^2}{\sqrt{\beta+(x_i-x_j)^2(y_i-y_j)^2}}\end{array}}\end{array}\right)$$

In this equation, n represents a net, p(n) represents a unique pair of pins i and j of the net n, x and y represent the x-, and y-coordinates of a particular pin, and $b_{i,j}$ represents a weighting factor that biases the function based on the desired closeness of pins i and j.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

Figure 1:
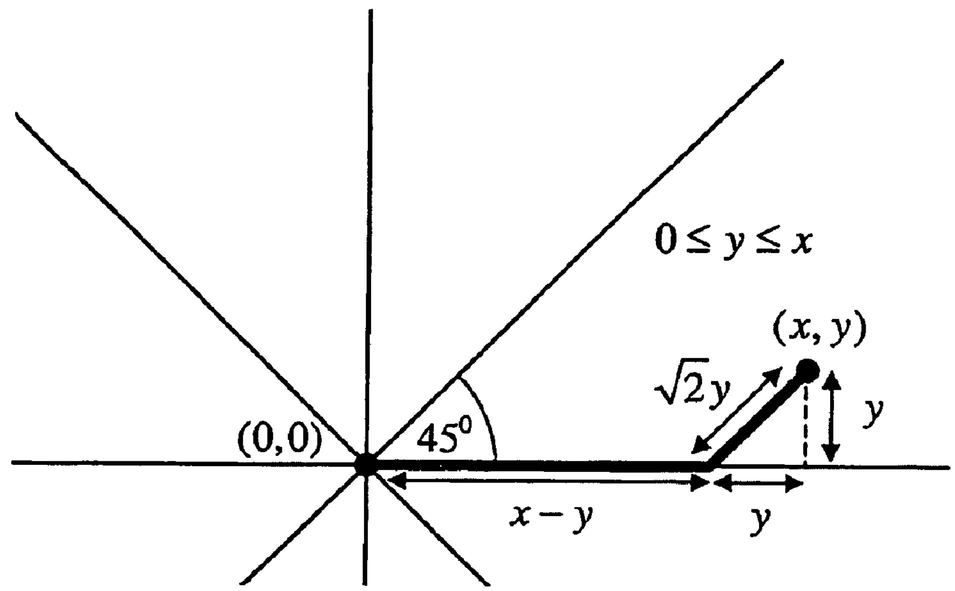
FIG. 1 illustrates the minimum wire length to connect a pin at (0,0) to a pin at (x, y) in an octilinear model.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments provide an analytical placement method that considers diagonal wiring. This method uses an objective function that accounts for the use of diagonal wiring during routing. Different embodiments of the invention use different objective functions. Section I below describes three objective functions for the following three wiring models: (1) an octilinear model that specifies horizontal, vertical, and ±45° wiring directions, (2) a hexagonal model that specifies three wiring directions that are arranged at 60° to one another, and (3) a hybrid model that specifies three wiring directions that are arranged as in the hexagonal case and a fourth that is perpendicular to one of the three directions. Section II then provides the overall flow of the analytical placer of some embodiments. Finally, Section III illustrates a computer system used in some embodiments of the invention.

I. Objective Function

A. Octilinear Model.

The octilinear model allows interconnect lines in horizontal, vertical, and ±45° preferred directions. For instance, in some embodiments that use a five-metal process, the octilinear model specifies vertical wiring on metal layer 1, horizontal wiring on metal layer 2, vertical wiring on metal layer 3, +45° wiring on metal layer 4, and −45° wiring on metal layer 5. This model is an octilinear model, as it allows interconnect lines to traverse in eight separate vector directions from any given point.

FIG. 1 illustrates that the minimum wire length to connect a pin at (0,0) to a pin at (x,y) in the octilinear model, is $x+(\sqrt{2}-1)y$ for the case $0\leqq y\leqq x$. For general (x,y), by symmetry, the minimum wire length L(x, y) from (0,0) to (x, y) is:

$L(x,y)=|x|+(\sqrt{2}-1)|y|$, when $0\leqq|y|\leqq|x|$, else $L(x,y)=|y|+(\sqrt{2}-1)|x|$.

The two cases may be unified if absolute values are used as follows:

$$L(x,y)=\frac{1}{\sqrt{2}}(|x|+|y|)+\left(1-\frac{1}{\sqrt{2}}\right)||x|-|y||,$$

where the following have been used $$\max(|x|,|y|)=\frac{|x|+|y|}{2}+\frac{||x|-|y||}{2},$$

$$\min(|x|,|y|)=\frac{|x|+|y|}{2}-\frac{||x|-|y||}{2}.$$

In order to stabilize the process of numerically minimizing aggregate wire length subject to constraints, the sharp corner in the graph of the absolute value function at small values is to be avoided. To do this, each absolute value term |z| is approximated by a smooth function that is approximately quadratic for small values of z while remaining close to |z| for large values of z. One choice for this approximation is called "β-regularization" and uses the approximation $|z|\cong\sqrt{\beta+z^2}$ as described by the report by C. J. Alpert, T. F. Chan, A. B. Kahng, I. L. Markov, and P. Mulet "Faster Minimization of Linear Wirelength for Global Placement". If β-regularization is performed to smooth the outer absolute values in L(x,y), the following is obtained:

$$\begin{aligned}L(x,y)&\cong\frac{1}{\sqrt{2}}\left(\sqrt{\beta+x^2}+\sqrt{\beta+y^2}\right)+\\&\quad\left(1-\frac{1}{\sqrt{2}}\right)\sqrt{\beta+(|x|-|y|)^2}\\&=\frac{1}{\sqrt{2}}\left(\sqrt{\beta+x^2}+\sqrt{\beta+y^2}\right)+\\&\quad\left(1-\frac{1}{\sqrt{2}}\right)\sqrt{\beta+x^2+y^2-2|xy|}\end{aligned}\qquad\text{A}$$

In order to smooth the remaining absolute value term |xy|, some embodiments do not directly apply β-regularization because this can lead to the square root of a negative number when x and y are small. In other words, the approximation $$\sqrt{\beta+x^2+y^2-2|xy|}\cong\sqrt{\beta+x^2+y^2-2\sqrt{\beta+x^2y^2}}$$

is not used because $\beta-2\sqrt{\beta}<0$ or small β.

Instead, some embodiments use the following alternative smoothing method to avoid this difficulty:

$$\sqrt{\beta + x^2 + y^2 - 2|xy|} = \sqrt{\beta + x^2 + y^2 - \frac{2x^2y^2}{|xy|}} \cong \sqrt{\beta + x^2 + y^2 - \frac{2x^2y^2}{\sqrt{\beta + x^2y^2}}}. \quad \text{B}$$

This is because $$\beta + x^2 + y^2 - \frac{2x^2y^2}{\sqrt{\beta + x^2y^2}} > 0.$$

This can be proven (recall that β>0) by observing that it is trivially true if x=0 or y=0. and if x and y are both nonzero, then $$\beta + x^2 + y^2 - \frac{2x^2y^2}{\sqrt{\beta + x^2y^2}} > (|x| - |y|)^2 + 2|xy| - \frac{2x^2y^2}{\sqrt{\beta + x^2y^2}} \geq (|x| - |y|)^2 + 2|xy| - \frac{2x^2y^2}{\sqrt{x^2y^2}} = (|x| - |y|)^2 \geq 0$$

Equation C provides a smooth approximation $L_\beta(x,y)$ to the wire length L(x,y) that is obtained by appropriately smoothing the remaining absolute value term |xy| in Equation A by the approximation illustrated by Equation B.

$$L_\beta(x, y) = \frac{1}{\sqrt{2}}\left(\sqrt{\beta + x^2} + \sqrt{\beta + y^2}\right) + \left(1 - \frac{1}{\sqrt{2}}\right)\sqrt{\beta + x^2 + y^2 - \frac{2x^2y^2}{\sqrt{\beta + x^2y^2}}} \quad \text{C}$$

For the octilinear model, Equation C represents the approximate distance between two pins, where one is located at (0,0) and the other at (x,y). Equation D below represents an objective function that uses a more general representation of Equation C to express the distance between each unique pin pair of each net in a set of nets.

$$\text{Function} = \sum_n \sum_{p(n)} b_{i,j} \left( \begin{array}{l} \frac{1}{\sqrt{2}}\left(\sqrt{\beta + (x_i + x_j)^2} + \sqrt{\beta + (y_i - y_j)^2}\right) + \\ \left(1 - \frac{1}{\sqrt{2}}\right)\sqrt{\begin{array}{c} \beta + (x_i - x_j)^2 + (y_i - y_j)^2 - \\ \frac{2(x_i - x_j)^2(y_i - y_j)^2}{\sqrt{\beta + (x_i - x_j)^2(y_i - y_j)^2}} \end{array}} \end{array} \right) \quad \text{D}$$

In this equation, n represents a net, p(n) represents a unique pair of pins i and j of the net n, x and y represent the x-, and y-coordinates of a particular pin, and $b_{i,j}$ represents a weighting factor that biases the function based on the desired closeness of pins i and j.

Some embodiments express Equation C differently before trying to solve Equation D. One method involves approximating $L_\beta(x,y)$ by a quadratic function in the neighborhood of (x,y), solving the constrained quadratic minimization problem, and then iterating. A quadratic approximation for $L_\beta(x, y)$ may be found by writing selected square root terms using the fact that $$\sqrt{z} = \frac{z}{\sqrt{z}}$$

for z>0, as follows:

$$L_\beta(x, y) = \frac{\beta + x^2}{\sqrt{2(\beta + x^2)}} + \frac{\beta + y^2}{\sqrt{2(\beta + y^2)}} + \left(1 - \frac{1}{\sqrt{2}}\right)$$

$$\frac{\beta + x^2 + y^2 - \frac{2x^2y^2}{\sqrt{\beta + x^2y^2}}}{\sqrt{\beta + x^2 + y^2 - \frac{2x^2y^2}{\sqrt{\beta + x^2y^2}}}} = \left[\frac{1}{\sqrt{2(\beta + x^2)}} + \frac{1}{\sqrt{2(\beta + y^2)}} + \left(1 - \frac{1}{\sqrt{2}}\right)\left(\frac{1}{\sqrt{\beta + x^2 + y^2 - 2x^2y^2 / \sqrt{\beta + x^2y^2}}}\right)\right]\beta +$$

$$\left[\frac{1}{\sqrt{2(\beta + x^2)}} + \left(1 - \frac{1}{\sqrt{2}}\right)\left(\frac{1}{\sqrt{\beta + x^2 + y^2 - 2x^2y^2 / \sqrt{\beta + x^2y^2}}}\right)\right]x^2 + \left[\frac{1}{\sqrt{2(\beta + y^2)}} + \left(1 - \frac{1}{\sqrt{2}}\right)\left(\frac{1}{\sqrt{\beta + x^2 + y^2 - 2x^2y^2 / \sqrt{\beta + x^2y^2}}}\right)\right]y^2 +$$

$$\left[\left(1 - \frac{1}{\sqrt{2}}\right)\left(\frac{-2xy}{\sqrt{\beta + x^2y^2}\sqrt{\beta + x^2 + y^2 - 2x^2y^2 / \sqrt{\beta + x^2y^2}}}\right)\right]xy = [w_\beta]\beta + [w_{x^2}]x^2 + [w_{y^2}]y^2 + [w_{xy}]xy$$

In this formulation, it is again assumed that one pin is at (0,0) and the other is at (x,y). The weights $w_\beta$, $w_{x^2}$, $w_{y^2}$, and $w_{xy}$ would be viewed as constants when approximating $L_\beta(x,y)$ as a quadratic and, for the purpose of this minimization step, the initial term $[w_\beta]\beta$ could be ignored, as it would be viewed as a constant. Therefore, the constrained quadratic minimization problem involves terms of the form $$[w_{x^2}]x^2 + [w_{y^2}]y^2 + [w_{xy}]xy$$

where the weights, computed just before the constrained minimization and then held fixed, are given by $$w_{x^2} = \frac{1}{\sqrt{2(\beta + x^2)}} + \left(1 - \frac{1}{\sqrt{2}}\right)\left(\frac{1}{\sqrt{\beta + x^2 + y^2 - 2x^2y^2 / \sqrt{\beta + x^2y^2}}}\right)$$

$$w_{y^2} = \frac{1}{\sqrt{2(\beta + y^2)}} + \left(1 - \frac{1}{\sqrt{2}}\right)\left(\frac{1}{\sqrt{\beta + x^2 + y^2 - 2x^2y^2 / \sqrt{\beta + x^2y^2}}}\right)$$

$$w_{xy} = \left(1 - \frac{1}{\sqrt{2}}\right)\left(\frac{-2xy}{\sqrt{\beta + x^2y^2}\sqrt{\beta + x^2 + y^2 - 2x^2y^2 / \sqrt{\beta + x^2y^2}}}\right)$$

Figure 2:
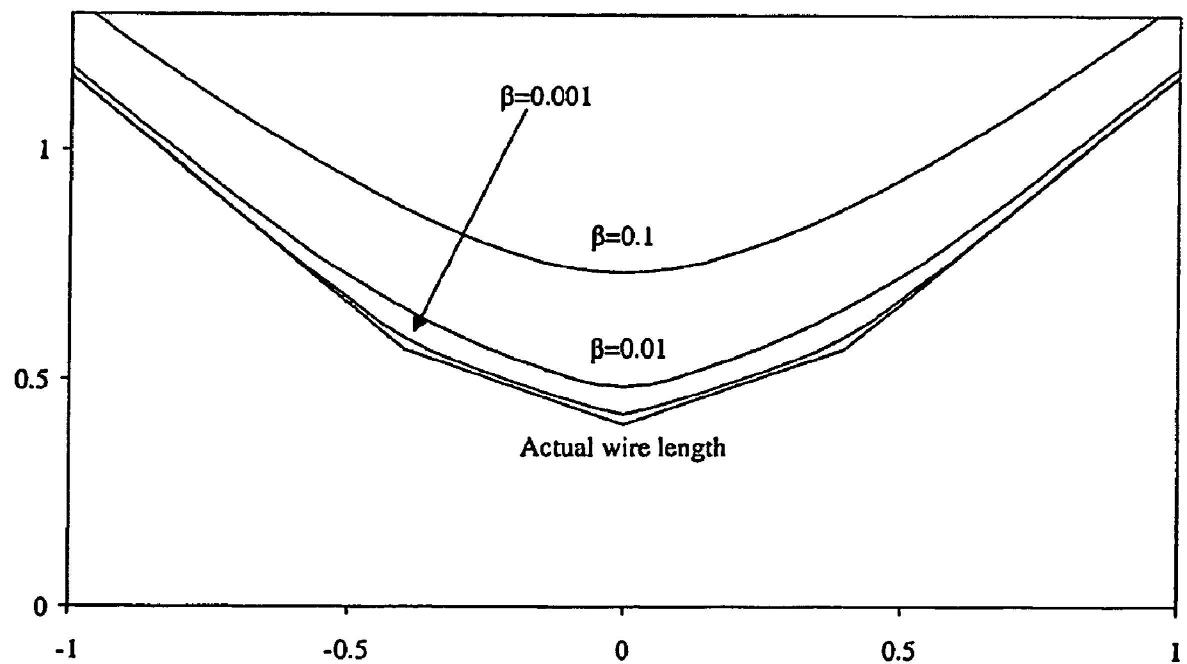
FIG. 2 illustrates an example to show smoothed wire lengths.

FIG. 2 illustrates an example to show the smoothed wire length, using x=0.4. plotting length L(x,y) and smoothed length $L_\beta(x,y)$ versus y for various values of β. As shown in this figure, the approximation improves as β decreases, while maintaining smoothness.

B. Hexagonal Model.

The hexagonal model specifies three preferred wiring directions that are arranged at 60° to one another. For example, in some embodiments that use a four-metal process, the hexagonal model specifies vertical wiring on metal layer 1, horizontal wiring on metal layer 2, +60° wiring on metal layer 3, and −60° wiring on metal layer 4. In this case, it is assumed that wiring on layer 1 can be ignored as it has relatively little amount of space for wiring.

Figure 3:
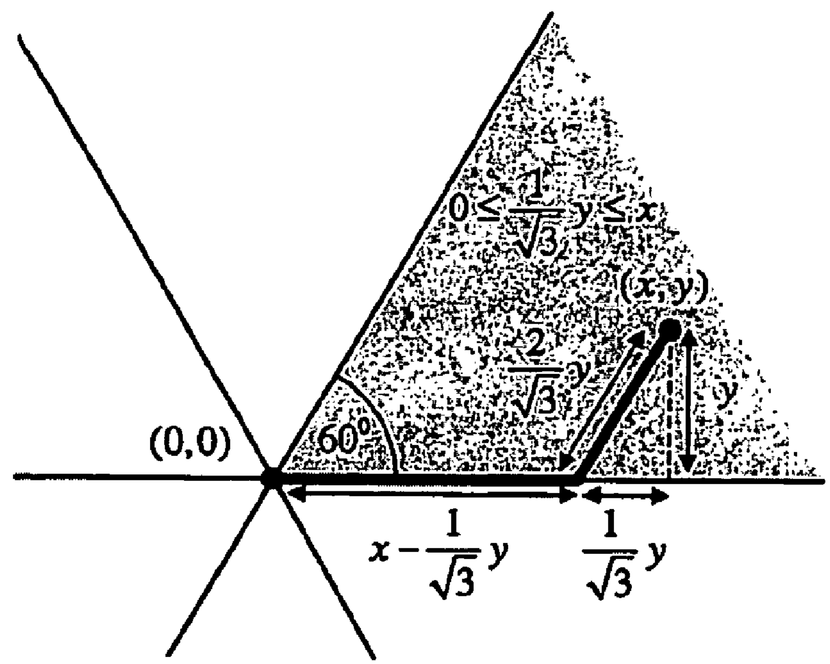
FIGS. 3 and 4 illustrate the minimum wire length to connect a pin at (0,0) to a pin at (x, y) in a hexagonal model.

FIG. 3 illustrates that the minimum wire length to connect a pin at (0,0) to a pin at (x,y) in the hexagonal model, is $$x + \frac{1}{\sqrt{3}}y,$$

in the case that $$0 \le \frac{1}{\sqrt{3}}y \le x.$$

For the case that $$0 \le x \le \frac{1}{\sqrt{3}}y,$$

Figure 4:
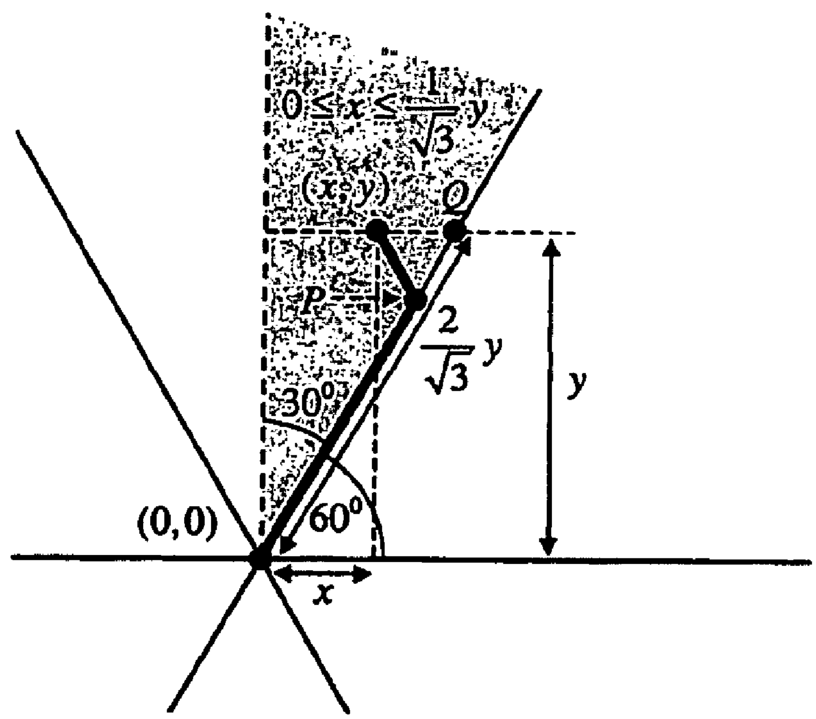

FIG. 4 illustrates that the minimum wire length is $$\frac{2}{\sqrt{3}}y.$$

This wire length may be justified by observing that the triangle formed by (x,y), P, and Q is equilateral, and therefore the total wire length from (0,0) to (x,y) is equal to the length of the segment from (0,0) to Q. Thus, for general (x,y) by symmetry, the minimum wire length L(x,y) from (0,0) to (x,y) may be written as follows:

$$\text{If } 0 \le \frac{1}{\sqrt{3}}|y| \le |x| \text{ then } L(x, y) = |x| + \frac{1}{\sqrt{3}}|y|,$$

$$\text{else } L(x, y) = \frac{2}{\sqrt{3}}|y|$$

These two cases may be unified by using absolute value notation as follows:

$$L(x, y) = \frac{1}{2}|x| + \frac{\sqrt{3}}{2}|y| + \frac{1}{2}\left||x| - \frac{1}{\sqrt{3}}|y|\right|.$$

Beta-regularization can be performed to smooth the absolute values as follows:

$$\begin{aligned} L(x, y) &\cong \frac{1}{2}\sqrt{\beta + x^2} + \frac{\sqrt{3}}{2}\sqrt{\beta + y^2} + \frac{1}{2}\sqrt{\beta + \left(|x| - \frac{1}{\sqrt{3}}|y|\right)^2} \\ &= \frac{1}{2}\sqrt{\beta + x^2} + \frac{\sqrt{3}}{2}\sqrt{\beta + y^2} + \\ &\quad \frac{1}{2}\sqrt{\beta + x^2 + \frac{1}{3}y^2 - \frac{2}{\sqrt{3}}|xy|}. \end{aligned}$$

This leads to the defining of the smooth approximation to wire length, treating |xy| as earlier to avoid taking square roots of negative values, as follows:

$$L_\beta(x, y) = \frac{1}{2}\sqrt{\beta + x^2} + \frac{\sqrt{3}}{2}\sqrt{\beta + y^2} + \frac{1}{2}\sqrt{\beta + x^2 + \frac{1}{3}y^2 - \frac{2x^2y^2}{\sqrt{3(\beta + x^2y^2)}}} \quad \text{E}$$

For the hexagonal model, Equation E represents the approximate distance between two pins, where one is located at (0,0) and the other at (x,y). Equation F below represents an objective function that uses a more general representation of Equation E to express the distance between each unique pin pair of each net in a set of nets.

$$Function = \sum_n \sum_{p(n)} b_{i,j} \left( \frac{1}{2}\sqrt{\beta + (x_i - x_j)^2} + \frac{\sqrt{3}}{2}\left(+\sqrt{\beta + (y_i + y_j)^2}\right) + \frac{1}{2}\sqrt{\beta + (x_i - x_j)^2 + \frac{1}{3}(y_i - y_j)^2 - \frac{2(x_i - x_j)^2(y_i - y_j)^2}{\sqrt{3(\beta + (x_i - x_j)^2(y_i - y_j)^2)}}} \right) \quad \text{F}$$

In this equation, n represents a net, p(n) represents a unique pair of pins i and j of the net n, x and y represent the x-, and y-coordinates of a particular pin, and $b_{i,j}$ represents a weighting factor that biases the function based on the desired closeness of pins i and j.

As for the embodiments that use the octilinear model, some embodiments that use the hexagonal model use a quadratic approximation for $L_\beta(x,y)$ (which Equation E represents) by re-writing selected square root terms $$\sqrt{z} \text{ as } \frac{z}{\sqrt{z}}.$$

This approach results in the following expression for $L_\beta(x,y)$.

$$L_\beta(x, y) = \frac{\beta + x^2}{2\sqrt{\beta + x^2}} + \frac{\sqrt{3}(\beta + y^{2'})}{2\sqrt{\beta + y^2}} +$$

-continued $$\frac{\beta+x^2+\frac{1}{3}y^2-\frac{2x^2y^2}{\sqrt{3(\beta+x^2y^2)}}}{2\sqrt{\beta+x^2+\frac{1}{3}y^2-\frac{2x^2y^2}{\sqrt{3(\beta+x^2y^2)}}}} = \left[\frac{1}{2\sqrt{\beta+x^2}} + \frac{\sqrt{3}}{2\sqrt{\beta+y^2}} + \frac{1}{2\sqrt{\beta+x^2+\frac{1}{3}y^2-2x^2y^2/\sqrt{3(\beta+x^2y^2)}}}\right]$$

$$\beta+\left[\frac{1}{2\sqrt{\beta+x^2}}+\frac{1}{2\sqrt{\beta+x^2+\frac{1}{3}y^2-2x^2y^2/\sqrt{3(\beta+x^2y^2)}}}\right]$$

$$x^2+\left[\frac{\sqrt{3}}{2\sqrt{\beta+y^2}}+\frac{1}{6\sqrt{\beta+x^2+\frac{1}{3}y^2-2x^2y^2/\sqrt{3(\beta+x^2y^2)}}}\right]$$

$$y^2+\left[\frac{-xy}{\sqrt{3(\beta+x^2y^2)}\sqrt{\beta+x^2+\frac{1}{3}y^2-2x^2y^2/\sqrt{3(\beta+x^2y^2)}}}\right] =$$

$$[w_\beta]\beta+[w_{x^2}]x^2+[w_{y^2}]y^2+[w_{xy}]xy$$

In this formulation, it is again assumed that one pin is at (0,0) while the other is at (x,y). The weights $w_\beta$, $w_{x^2}$, $w_{y^2}$, and $w_{xy}$ would be viewed as constants when approximating $L_\beta(x,y)$ as a quadratic and, for the purpose of this minimization step, the initial term $[w_\beta]\beta$ could be ignored, as it would be viewed as a constant. Therefore, the constrained quadratic minimization problem involves terms of the form $$[w_{x^2}]x^2+[w_{y^2}]y^2+[w_{xy}]xy$$

where the weights, computed just before the minimization and then held fixed, are given by $$w_{x^2}=\frac{1}{2\sqrt{\beta+x^2}}+\frac{1}{2\sqrt{\beta+x^2+\frac{1}{3}y^2-2x^2y^2/\sqrt{3(\beta+x^2y^2)}}}$$

$$w_{y^2}=\frac{\sqrt{3}}{2\sqrt{\beta+y^2}}+\frac{1}{6\sqrt{\beta+x^2+\frac{1}{3}y^2-2x^2y^2/\sqrt{3(\beta+x^2y^2)}}}$$

$$w_{xy}=\frac{-xy}{\sqrt{3(\beta+x^2y^2)}\sqrt{\beta+x^2+\frac{1}{3}y^2-2x^2y^2/\sqrt{3(\beta+x^2y^2)}}}$$

C. Hybrid Model.

In the hybrid model, there are three layers with preferred directions arranged at 60° to one another and an additional layer perpendicular to one of these three layers. For example, in some embodiments that use a five-metal process, the hybrid model specifies vertical wiring on metal layer 1, horizontal wiring on metal layer 2, +60° wiring on metal layer 3, −60° wiring on metal layer 4, and vertical wiring on metal layer 5. Again, in this case, it is assumed that wiring on layer 1 can be ignored as it has relatively little amount of space for wiring.

Figure 5:
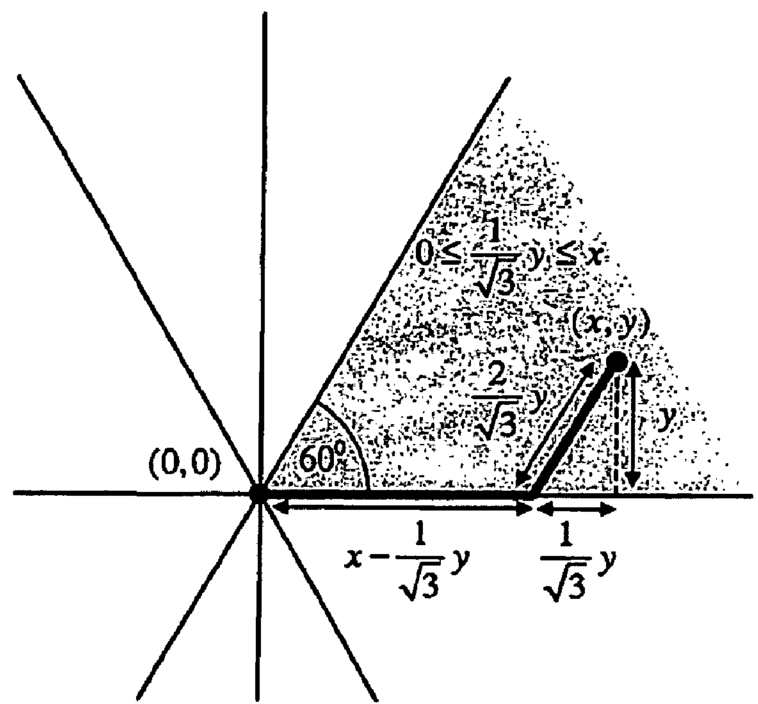
FIGS. 5 and 6 illustrate the minimum wire length to connect a pin at (0,0) to a pin at (x, y) in a hybrid wiring model.

FIG. 5 illustrates that the minimum wire length to connect a pin at (0,0) to a pin at (x,y) in the hybrid model, is $$x+\frac{1}{\sqrt{3}}y,$$

for the case $$0\le\frac{1}{\sqrt{3}}y\le x.$$

In this case, this length is identical to the hexagonal three-layer case because the additional perpendicular layer is not used. For the case $$0\le x\le\frac{1}{\sqrt{3}}y,$$

Figure 6:
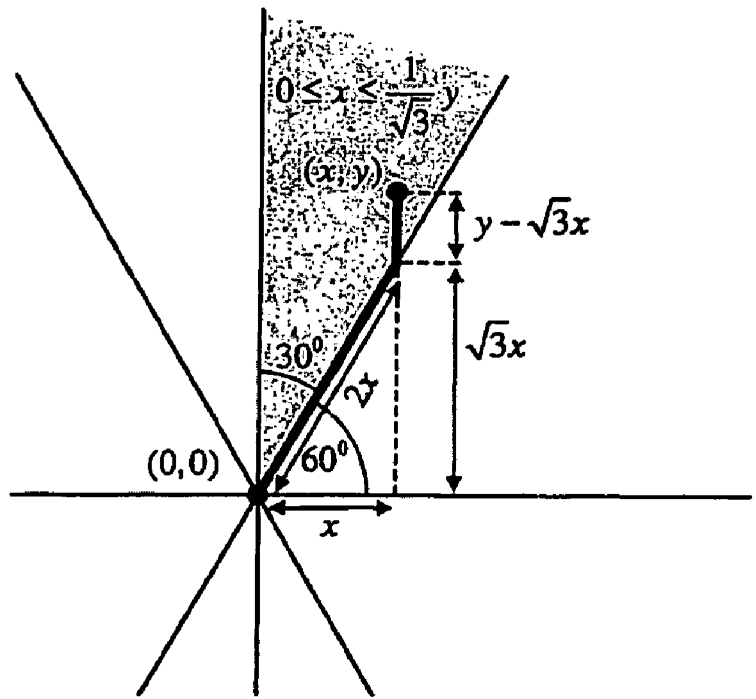

FIG. 6 illustrates that the minimum wire length is $(2-\sqrt{3})x+y$. This case is different from the hexagonal three-layer case because the perpendicular layer is used.

Thus, for general (x,y) by symmetry, the minimum wire length L(x,y) from (0,0) to (x,y) may be written as follows:

$$L(x,y)=|x|+\frac{1}{\sqrt{3}}|y|,\text{ when } 0\le\frac{1}{\sqrt{3}}|y|\le|x|,$$
$$\text{else } L(x,y)=(2-\sqrt{3})|x|+|y|.$$

These two cases may be unified by using absolute value notation as follows:

$$L(x,y)=\frac{3}{2}\left(1-\frac{1}{\sqrt{3}}\right)|x|+\frac{1}{2}\left(1+\frac{1}{\sqrt{3}}\right)|y|+\frac{\sqrt{3}-1}{2}\left||x|-\frac{1}{\sqrt{3}}|y|\right|$$

Beta-regularization to smooth the absolute values can be performed as follows:

$$L(x,y)\cong\frac{3}{2}\left(1-\frac{1}{\sqrt{3}}\right)\sqrt{\beta+x^2}+\frac{1}{2}\left(1+\frac{1}{\sqrt{3}}\right)\sqrt{\beta+y^2}+\frac{\sqrt{3}-1}{2}\sqrt{\beta+\left(|x|-\frac{1}{\sqrt{3}}|y|\right)^2}=$$
$$\frac{3}{2}\left(1-\frac{1}{\sqrt{3}}\right)\sqrt{\beta+x^2}+\frac{1}{2}\left(1+\frac{1}{\sqrt{3}}\right)\sqrt{\beta+y^2}+\frac{\sqrt{3}-1}{2}\sqrt{\beta+x^2+\frac{1}{3}y^2-\frac{2}{\sqrt{3}}|xy|}$$

which leads to the defining of the smooth approximation to wire length, treating |xy| as done earlier to avoid taking square roots of negative values, as follows:

$$L_\beta(x,y)=\left(\begin{array}{c}\frac{3}{2}\left(1-\frac{1}{\sqrt{3}}\right)\sqrt{\beta+x^2}+\frac{1}{2}\left(1+\frac{1}{\sqrt{3}}\right)\left(\sqrt{\beta+y^2}\right)+\\ \frac{\sqrt{3}-1}{2}\sqrt{\beta+x^2+\frac{1}{3}y^2-\frac{2x^2y^2}{\sqrt{3(\beta+x^2y^2)}}}\end{array}\right)\qquad\text{G}$$

For the hybrid model, Equation G represents the approximate distance between two pins, where one is located at (0,0) and the other at (x,y). Equation H below represents an objective function that uses a more general representation of Equation G to express the distance between each unique pin pair of each net in a set of nets.

$$\text{Function}=\sum_{n}\sum_{p(n)}b_{i,j}\left(\begin{array}{c}\frac{3}{2}\left(1-\frac{1}{\sqrt{3}}\right)\sqrt{\beta+(x_i-x_j)^2}+\\ \frac{1}{2}\left(1+\frac{1}{\sqrt{3}}\right)\left(\sqrt{\beta+(y_i-y_j)^2}\right)+\\ \frac{\sqrt{3}-1}{2}\sqrt{\begin{array}{c}\beta+(x_i-x_j)^2+\frac{1}{3}(y_i-y_j)^2-\\ \frac{2(x_i-x_j)^2(y_i-y_j)^2}{\sqrt{3(\beta+(x_i-x_j)^2(y_i-y_j)^2)}}\end{array}}\end{array}\right)\qquad\text{H}$$

In this equation, n represents a net, p(n) represents a unique pair of pins i and j of the net n, x and y represent the x-, and y-coordinates of a particular pin, and $b_{i,j}$ represents a weighting factor that biases the function based on the desired closeness of pins i and j.

As for the embodiments that use the octilinear and hexagonal models, some embodiments that use the hybrid model use a quadratic approximation for $L_\beta(x,y)$ (which Equation G represents) by re-writing selected square root terms $$\sqrt{z}\ \text{as}\ \frac{z}{\sqrt{z}}.$$

This approach results in the following expression for $L_\beta(x,y)$.

$$L_\beta(x,y)=\frac{3}{2}\left(1-\frac{1}{\sqrt{3}}\right)\frac{\beta+x^2}{\sqrt{\beta+x^2}}+\frac{1}{2}\left(1+\frac{1}{\sqrt{3}}\right)\frac{\beta+y^2}{\sqrt{\beta+y^2}}+\left(\frac{\sqrt{3}-1}{2}\right)\frac{\beta+x^2+\frac{1}{3}y^2-\frac{2x^2y^2}{\sqrt{3(\beta+x^2y^2)}}}{\sqrt{\beta+x^2+\frac{1}{3}y^2-\frac{2x^2y^2}{\sqrt{3(\beta+x^2y^2)}}}}=$$

-continued $$\left[\frac{3}{2}\left(1-\frac{1}{\sqrt{3}}\right)\frac{1}{\sqrt{\beta+x^2}}+\frac{1}{2}\left(1+\frac{1}{\sqrt{3}}\right)\frac{1}{\sqrt{\beta+y^2}}+\left(\frac{\sqrt{3}-1}{2}\right)\frac{1}{\sqrt{\beta+x^2+\frac{1}{3}y^2-2x^2y^2/\sqrt{3(\beta+x^2y^2)}}}\right]\beta+$$

$$\left[\frac{3}{2}\left(1-\frac{1}{\sqrt{3}}\right)\frac{1}{\sqrt{\beta+x^2}}+\left(\frac{\sqrt{3}-1}{2}\right)\frac{1}{\sqrt{\beta+x^2+\frac{1}{3}y^2-2x^2y^2/\sqrt{3(\beta+x^2y^2)}}}\right]x^2+$$

$$\left[\frac{1}{2}\left(1+\frac{1}{\sqrt{3}}\right)\frac{1}{\sqrt{\beta+y^2}}+\left(\frac{\sqrt{3}-1}{6}\right)\frac{1}{\sqrt{\beta+x^2+\frac{1}{3}y^2-2x^2y^2/\sqrt{3(\beta+x^2y^2)}}}\right]y^2+$$

$$\left[\frac{-\left(\sqrt{3}-1\right)xy}{\sqrt{3(\beta+x^2y^2)}\sqrt{\beta+x^2+\frac{1}{3}y^2-2x^2y^2/\sqrt{3(\beta+x^2y^2)}}}\right]xy=[w_\beta]\beta+[w_{x^2}]x^2+[w_{y^2}]y^2+[w_{xy}]xy$$

In this formulation, it is again assumed that one pin is at (0,0) while the other is at (x,y). The weights $w_\beta$, $w_{x^2}$, $w_{y^2}$ and $w_{xy}$ would be viewed as constants when approximating $L_\beta(x,y)$ as a quadratic and, for the purpose of this minimization step, the initial term $[w_\beta]\beta$ could be ignored, as it would be viewed as a constant. Therefore, the constrained quadratic minimization problem involves terms of the form $$[w_{x^2}]x^2+[w_{y^2}]y^2+[w_{xy}]xy$$

where the weights, computed just before the minimization and then held fixed, are given by $$w_{x^2}=\frac{3}{2}\left(1-\frac{1}{\sqrt{3}}\right)\frac{1}{\sqrt{\beta+x^2}}+\left(\frac{\sqrt{3}-1}{2}\right)\frac{1}{\sqrt{\beta+x^2+\frac{1}{3}y^2-2x^2y^2/\sqrt{3(\beta+x^2y^2)}}}$$

$$w_{y^2}=\frac{1}{2}\left(1+\frac{1}{\sqrt{3}}\right)\frac{1}{\sqrt{\beta+y^2}}+\left(\frac{\sqrt{3}-1}{6}\right)\frac{1}{\sqrt{\beta+x^2+\frac{1}{3}y^2-2x^2y^2/\sqrt{3(\beta+x^2y^2)}}}$$

$$w_{xy}=\frac{-\left(\sqrt{3}-1\right)xy}{\sqrt{3(\beta+x^2y^2)}\sqrt{\beta+x^2+\frac{1}{3}y^2-2x^2y^2/\sqrt{3(\beta+x^2y^2)}}}$$

II. Overall Flow of Analytical Placer

Figure 7:
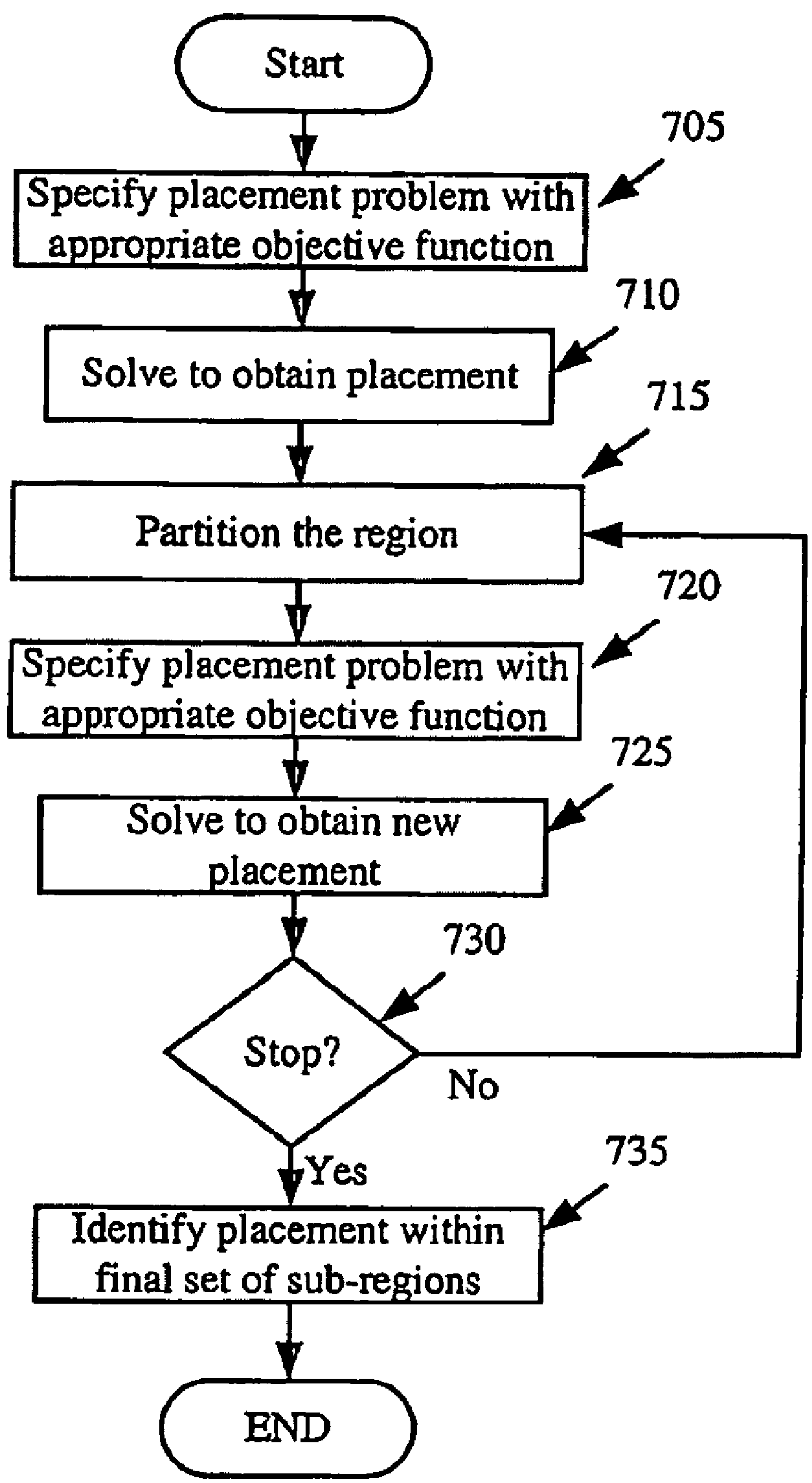
FIGS. 7-9 illustrate an analytical placement process of some embodiments of the invention.

FIG. 7 illustrates a process 700 that uses one of the above-described objective functions to identify a placement for a set of circuit modules in a layout region. The set of circuit modules can include all or some of the modules in the layout region. The layout region can be the entire layout or a portion of the layout. Also, the layout can be the layout of an entire IC or a portion of an IC.

Several nets are associated with the circuit modules in the layout region or the pins of these modules. In particular, each net has several circuit elements associated with it (i.e., each net is defined to include several circuit elements). The circuit elements of the nets are the pins in some embodiments, while they are the circuit modules in other embodiments. Some embodiments specify exact locations for the pins on the modules, while other embodiments assume that the pins of each module are located at a particular module location (e.g., the origin of the module). Yet other embodiments specify exact pin locations for fixed modules while specifying a particular module location for all pins of the movable modules.

Before the process 700 starts, each circuit module and its pin(s) have initial positions within the layout region. In some embodiments, the initial circuit-element positions are random. In other embodiments, a previous physical-design operation, such as floor planning, partially or completely specifies the initial positions of these elements. Other embodiments use another placer to specify the initial positions of the circuit elements, and then use process 700 to optimize the placement configuration for a wiring architecture that uses diagonal wiring.

The process 700 initially specifies (at 705) a placement problem to solve. This placement problem includes an objective function that computes a placement cost. This objective function accounts for the use of diagonal wiring during routing and depends on the particular wiring model. For instance, some embodiments use equation D, F, or H as the objective function when they use the octilinear, hexagonal, or hybrid wiring model. In these embodiments, the process formulates an objective function by first identifying each unique pin-pair of each net that is associated with the circuit modules that the process 700 is placing. For each unique pin-pair, the process specifies one instance of equation C, E, or G to express the distance between the pins. The process expresses the objective function as a sum of all the specified equations.

The placement problem specified at 705 also includes a constraint that the pins should be located somewhere in the region. After 705, the process solves (at 710) the placement problem to identify an initial placement of the circuit modules. Different embodiments use different solvers to solve the placement problem. The task of the solver is to identify a solution that minimizes the objective function while satisfying the specified constraints. In some embodiments, the solver examines several solutions, where each solution provides a real number value for each placement problem variable (e.g., in some embodiments, for each module location variable, where the pin locations are derived based on the module locations).

As mentioned above, different embodiments use different solvers that are based on different non-linear optimization techniques to solve the above-mentioned non-linear objective functions. For instance, freeware solvers (such as L-BFGS solver, which is based on a quasi-Newton technique) or licensed solvers (such as the Knitro solver, which is based on interior-point technique) can be used. The L-BFGS solver is discussed in R. H. Byrd, P. Lu, and J. Nocedal "A Limited Memory Algorithm for Bound Constrained Optimization", SIAM Journal on Scientific and Statistical Computing, 16, 5. pp. 1190-1208. and Zhu, R. H. Byrd and J. Nocedal "L-BFGS-B: Algorithm 778: L-BFGS-B, Fortran routines for large scale bound constrained optimization" (1997), ACM Transactions on Mathematical Software, Vol. 23. No. 4, pp. 550-560. The Knitro solver is discussed in R. Byrd, M. E. Hriber, and J. Nocedal: "An Interior-Point Method for Large Scale Nonlinear Programming" (1999), SIAM J. Optimization, 9, 4. pp. 877-900.

Figure 8:
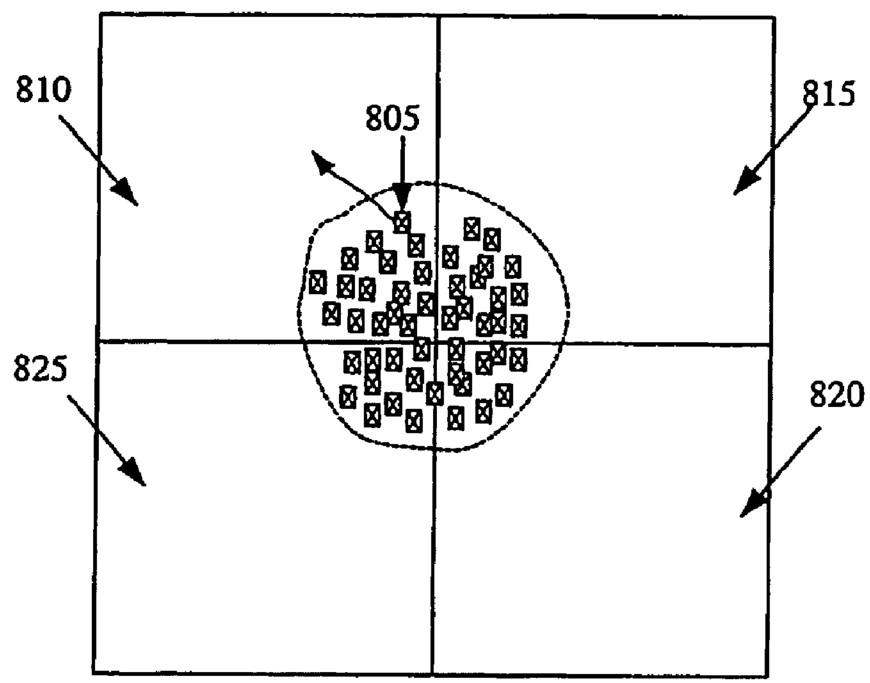

In the initial placement configuration that the solver identifies at 710, the circuit modules will likely be clustered around the center of the layout region. FIG. 8 illustrates one example of such clustering. The process 700 addresses this clustering by iteratively (1) partitioning (at 715) the region into smaller and smaller, (2) formulating (at 720) a new placement problem for each iteration, and (3) solving (at 725) each placement problem to distribute gradually the modules within the regions.

Specifically, after 710, the process partitions (at 715) the layout region. Different embodiments use different partitioning techniques. Some embodiments use a quad-partitioning technique that partitions a region into four sub-regions. FIG. 8 illustrates one such partitioning.

Next, at 720, the process 700 formulates another placement problem. This placement problem includes an objective function that is similar to the objective function that was formulated at 705. Some embodiments, however, reduce the smoothing-parameter $\beta$ at each iteration through 720 to have the placement converge to the constrained minimum wire length solution.

The problem formulated at 720 also specifies placement constraints for the circuit modules. The placement constraints are based on the partitioning in the last iteration of 715. Specifically, the placement constraints assign each module and its pins to a particular sub-region that the process defined in the last iteration through 715. For instance, in FIG. 8, the process might specify that the x- and y-coordinates of the pins of module 805 have to be in sub-region 810 (i.e., in the coordinate range of sub-region 810). A variety of known techniques can be used to assign modules to partitioned sub-regions. For instance, some embodiments use the techniques described in J. Vygen, Four-way partitioning of two-dimensional sets, Report No. 00900-OR, Research Institute for Discrete Mathematics, University of Bonn. See also J. Vygen "Plazierung im VLSI-Design und ein zweidimensional Zerlegungsproblem, Ph.D. thesis. University of Bonn, 1997; see also Jen Vygen's website:

http://www.or.uni-bonn.de/home/vygen/indexeng.html.

For each particular sub-region that the process defined in the last iteration of 715, the process also specifies (at 720) a centering constraint that requires the average x- and y-coordinates of the modules in the sub-region to be the x- and y-coordinates of the sub-region's center. In other embodiments, the centering constraint requires the average x- and y-coordinates to be within a specific distance from the sub-region's center. The centering constraint causes the modules to distribute more evenly in the partitioned sub-regions.

In some embodiments, the process also distributes (at 720) the circuit modules in each sub-region defined at 715. In some of these embodiments, the solver starts with the coordinates of the distributed circuit elements. In other embodiments, however, the process 700 does not specify any new distribution. In these embodiments, the solver (at 725) starts from the last-specified coordinates of the circuit elements.

At 725, the process solves the placement problem specified at 720. This solving operation is similar to the one that is performed at 710 except that the constraints identified at 720 cause the operation at 725 to identify each pin or module location within the sub-region specified for the pin or module.

Figure 9:
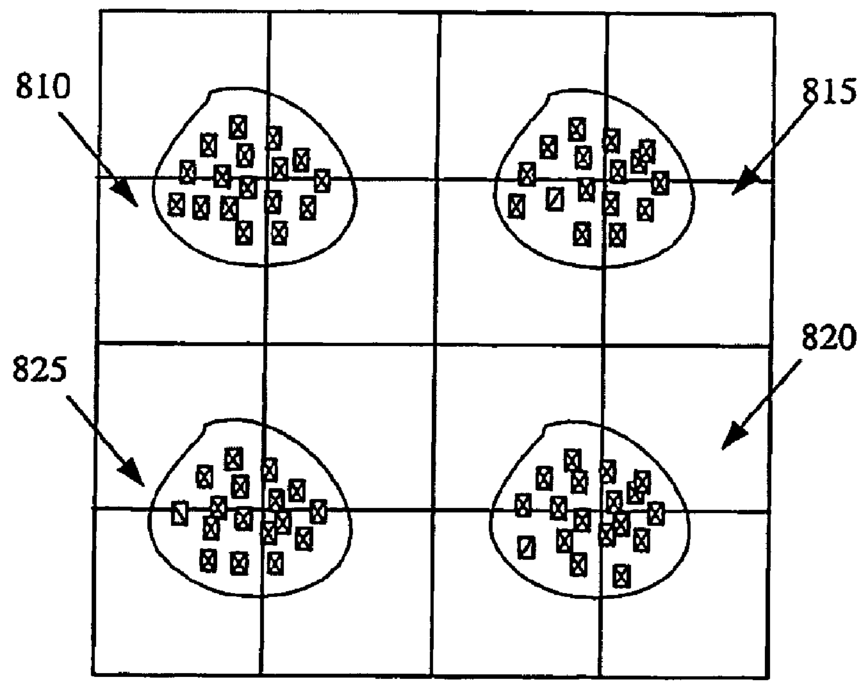

After 725, the process determines (at 730) whether it should stop its iterative operations. In some embodiments, the process stops when a sub-region identified at 715 has reached a particular size. When the process determines (at 730) that it should not stop, it transitions to 715 to partition further each sub-region that was identified in the previous iteration. Some embodiments use the same quad-partitioning grid at each iteration of 715. One such example is illustrated in FIG. 9, which shows each sub-region of FIG. 8 further divided into four smaller sub-regions. After the partitioning at 715, the process again (1) at 720 specifies a new placement problem with new placement constraints and reduced smoothing-parameter β and (2) at 725 solves the formulated placement problem.

Each iterative solve operation at 730 results in the clustering of the circuit modules around the center of their sub-regions. For instance, FIG. 9 illustrates the clustering of the circuit modules around the center of sub-regions 810, 815, 820, and 830. Accordingly, the iterative partitioning, formulation, and solve operations are intended to distribute gradually the modules within the region.

When the process 700 determines (at 730) that it should stop its iterations, it specifies (at 735) a final placement for each module in the final set of sub-regions that the process identified in its last iteration through 715. In some embodiments, the process identifies the final placement by using known legalization techniques for distributing a set of modules in a sub-region. After 735, the process 700 ends.

III. The Computer System

Figure 10:
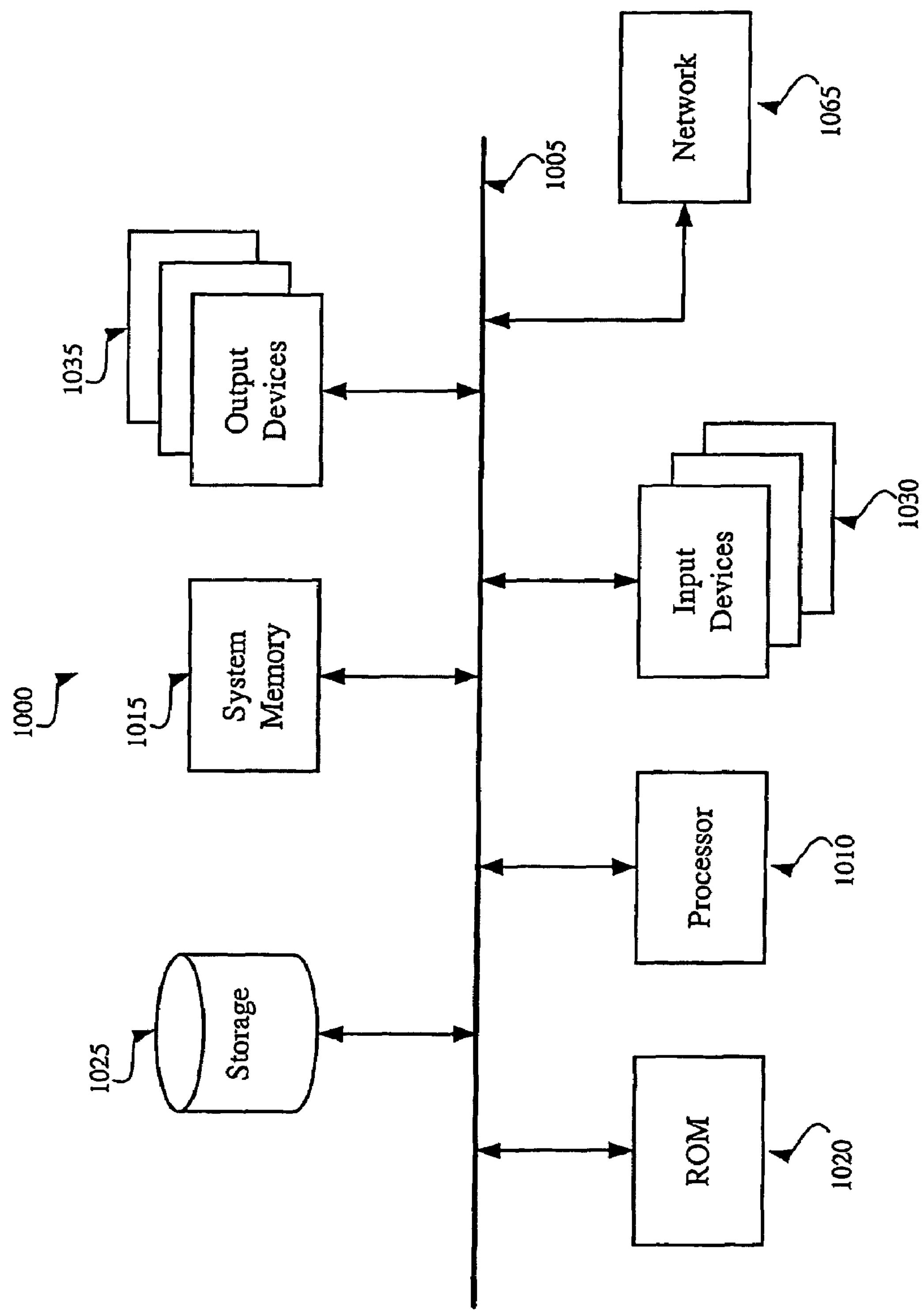
FIG. 10 presents a conceptual block diagram of a computer system that can be used in some embodiment of the invention.

FIG. 10 presents a computer system with which one embodiment of the present invention is implemented. Computer system 1000 includes a bus 1005, a processor 1010, a system memory 1015, a read-only memory 1020, a permanent storage device 1025, input devices 1030, and output devices 1035.

The bus 1005 collectively represents all system, peripheral, and chipset buses that communicatively connect the numerous internal devices of the computer system 1000. For instance, the bus 1005 communicatively connects the processor 1010 with the read-only memory 1020, the system memory 1015, and the permanent storage device 1025.

From these various memory units, the processor 1010 retrieves instructions to execute and data to process in order to execute the processes of the invention. The read-only-memory (ROM) 1020 stores static data and instructions that are needed by the processor 1010 and other modules of the computer system. The permanent storage device 1025, on the other hand, is read-and-write memory device. This device is a non-volatile memory unit that stores instruction and data even when the computer system 1000 is off. Some embodiments of the invention use a mass-storage device (such as a magnetic or optical disk and its corresponding disk drive) as the permanent storage device 1025. Other embodiments use a removable storage device (such as a floppy disk or zip® disk, and its corresponding disk drive) as the permanent storage device. Like the permanent storage device 1025, the system memory 1015 is a read-and-write memory device. However, unlike storage device 1025, the system memory is a volatile read-and-write memory, such as a random access memory. The system memory stores some of the instructions and data that the processor needs at runtime. In some embodiments, the invention's processes are stored in the system memory 1015, the permanent storage device 1025, and/or the read-only memory 1020.

The bus 1005 also connects to the input and output devices 1030 and 1035. The input devices enable the user to communicate information and select commands to the computer system. The input devices 1030 include alphanumeric keyboards and cursor-controllers. The output devices 1035 display images generated by the computer system. For instance, these devices display IC design layouts. The output devices include printers and display devices, such as cathode ray tubes (CRT) or liquid crystal displays (LCD).

Finally, as shown in FIG. 10, bus 1005 also couples computer 1000 to a network 1065 through a network adapter (not shown). In this manner, the computer can be a part of a network of computers (such as a local area network ("LAN"), a wide area network ("WAN"), or an Intranet) or a network of networks (such as the Internet). Any or all of the components of computer system 1000 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. For instance, in some embodiments, the process 700 of FIG. 7 reduces the smoothing parameter β only after partitioning the region into smaller sub-regions. Other embodiments, however, optimize the placement at each level in the partitioning hierarchy by iteratively solving the placement problem for gradually decreasing smoothing parameter β. After optimizing the placement at a particular level, these embodiments go to the next level of partitioning (i.e., they partition the region further) and optimize the placement at that level by iteratively solving the placement problem for gradually decreasing smoothing parameter β. These embodiments proceed in this manner until the partitioned sub-regions are smaller than a threshold size. Thus, one of ordinary skill in the art would understand that the invention is not to be limited by the foregoing illustrative details, but rather is to be defined by the appended claims.

We claim:

1. An analytical placement method for identifying locations of circuit elements in a region of a layout, the method comprising:

a) formulating an objective function that accounts for diagonal wiring during routing;

b) solving the objective function to identify the locations of the circuit elements to be placed, wherein the objective function is continuously differentiable along at least a portion of a domain over which the objective function is defined.

2. The method of claim 1, wherein formulating the objective function further comprises:

a) identifying at least one pair of pins in the layout that have to be connected;

b) specifying the distance between the pin pair based on a distance formula that accounts for diagonal wiring during routing.

3. The method of claim 2, wherein the circuit elements are circuit modules, each circuit module having a set of pins, the region having a set of nets, wherein each net specifies a set of pins that have to be connected, wherein formulating the objective function further comprises:

a) identifying pairs of pins in the layout that have to be connected;

b) specifying a distance between each pin pair based on a distance formula that accounts for diagonal wiring during routing;

c) specifying the objective function as an amalgamation of the specified distance formulas.

4. The method of claim 3, wherein identifying pairs of pins in the layout comprises identifying each possible pair of pins of each net in the set of nets.

5. The method of claim 2, wherein the distance formula is based on a wiring model that is used for routing.

6. The method of claim 5, wherein the wiring model is an octilinear model that specifies horizontal, vertical, and ±45° wiring, wherein the distance formula is:

$$\left(\frac{1}{\sqrt{2}}\left(\sqrt{\beta+(x_i-x_j)^2}+\sqrt{\beta+(y_i-y_i)^2}\right)+\left(1-\frac{1}{\sqrt{2}}\right)\sqrt{\beta+(x_i+x_j)^2+(y_i-y_j)^2-\frac{2(x_i-x_j)^2(y_i-y_j)^2}{\sqrt{\beta+(x_i-x_j)^2(y_i-y_j)^2}}}\right)$$

wherein i and j represent the pins, x and y represent the x-, and y-coordinates of a particular pin, and β represents a smoothing parameter.

7. The method of claim 5, wherein the wiring model is a hexagonal model that specifies three wiring directions each at 60° to other directions, wherein the distance formula is:

$$\left(\frac{1}{2}\sqrt{\beta+(x_i-x_j)^2}+\frac{\sqrt{3}}{2}\left(\sqrt{\beta+(y_i-y_i)^2}\right)+\frac{1}{2}\sqrt{\beta+(x_i+x_j)^2+\frac{1}{3}(y_i-y_j)^2-\frac{2(x_i-x_j)^2(y_i-y_j)^2}{\sqrt{3(\beta+(x_i-x_j)^2(y_i-y_j)^2)}}}\right)$$

wherein i and j represent the pins, x and y represent the x-, and y-coordinates of a particular pin, and β represents a smoothing parameter.

8. The method of claim 5, wherein the wiring model is a model that specifies four wiring directions, three of which are at 60° to one another and a fourth is at 90° to one of the other three directions, wherein the distance formula is:

$$\left(\frac{3}{2}\left(1-\frac{1}{\sqrt{3}}\right)\sqrt{\beta+(x_i-x_j)^2}+\frac{1}{2}\left(1+\frac{1}{\sqrt{3}}\right)\left(\sqrt{\beta+(y_i-y_i)^2}\right)+\frac{\sqrt{3}-1}{2}\sqrt{\beta+(x_i+x_j)^2+\frac{1}{3}(y_i-y_j)^2-\frac{2(x_i-x_j)^2(y_i-y_j)^2}{\sqrt{3(\beta+(x_i-x_j)^2(y_i-y_j)^2)}}}\right)$$

wherein i and j represent the pins, x and y represent the x-, and y-coordinates of a particular pin, and β represents a smoothing parameter.

9. The method of claim 1, wherein the objective function is a first objective function, the method further comprising:

partitioning the region into a set of sub-regions;

specifying placement constraints based on the sub-regions;

finding a solution to a second objective function that satisfies the constraints, wherein the second objective function accounts for diagonal wiring during routing.

10. The method of claim 9, wherein the first and second objective functions are identical.

11. The method of claim 9, wherein the objective functions include a smoothing parameter, wherein the objective functions have different smoothing parameters.

12. The method of claim 9, wherein partitioning the region comprises partitioning the region into four sub-regions.

13. The method of claim 9, wherein specifying placement constraints comprises requiring each circuit element to be within a particular sub-region.

14. The method of claim 13, wherein specifying placement constraints further comprises requiring average x- and y-coordinates of the circuit elements in a sub-region to be within a particular range of a center of the sub-region.

15. The method of claim 13, wherein specifying placement constraints further comprises requiring average x- and y-coordinates of the circuit elements in a sub-region to be a center of the sub-region.

16. A computer readable medium that stores a computer program for an analytical placement method for identifying locations of circuit elements in a region of a layout, the program comprising instructions for:

a) formulating an objective function that accounts for diagonal wiring during routing; and b) solving the objective function to identify the locations of the circuit elements to be placed, wherein the objective function is continuously differentiable alone at least a portion of a domain over which the objective function is defined.

17. The computer readable medium of claim 16, wherein the instructions for formulating the objective function further comprises instructions for:

a) identifying at least one pair of pins in the layout that have to be connected;

b) specifying a distance between the pin pair based on a distance formula that accounts for diagonal wiring during routing.

18. The computer readable medium of claim 17, wherein the distance formula is based on a wiring model that is used for routing.

19. The computer readable medium of claim 16, wherein the objective function is a first objective function, the computer program further comprising instructions for:

partitioning the region into a set of sub-regions;

specifying placement constraints based on the sub-regions;

finding a solution to a second objective function that satisfies the constraints, wherein the second objective function accounts for diagonal wiring during routing.

20. The computer readable medium of claim 19, wherein the instructions for specifying placement constraints comprise instructions for requiring each circuit element to be within a particular sub-region.

21. The computer readable medium of claim 20, wherein the instructions for specifying placement constraints further comprise instructions for requiring average x- and y-coordinates of the circuit elements in a sub-region to be within a particular range of a center of the sub-region.

22. The computer readable medium of claim 20, wherein the instructions for specifying placement constraints further comprise instructions for requiring average x- and y-coordinates of the circuit elements in a sub-region to be a center of the sub-region.

* * * * *